(12) United States Patent
Liu et al.

(10) Patent No.: US 10,643,008 B2
(45) Date of Patent: May 5, 2020

(54) TARGET ANALYTE DETECTION AND QUANTIFICATION IN SAMPLE GASES WITH COMPLEX BACKGROUND COMPOSITIONS

(71) Applicant: SpectraSensors, Inc., Rancho Cucamonga, CA (US)

(72) Inventors: Xiang Liu, Rancho Cucamonga, CA (US); Alfred Feitisch, Rancho Cucamonga, CA (US); Keith Benjamin Helbley, Riverside, CA (US); James Tedesco, Rancho Cucamonga, CA (US)

(73) Assignee: SpectraSensors, Inc., Rancho Cucamonga, CA (US)

( * ) Notice: Subject to any disclaimer, the term of this patent is extended or adjusted under 35 U.S.C. 154(b) by 1028 days.

(21) Appl. No.: 14/538,699

(22) Filed: Nov. 11, 2014

(65) Prior Publication Data

US 2016/0132617 A1     May 12, 2016

(51) Int. Cl.
| | | |
|---|---|---|
| *G01N 15/02* | (2006.01) | |
| *G06F 30/20* | (2020.01) | |
| *G01N 21/65* | (2006.01) | |
| *G01N 21/39* | (2006.01) | |
| *G01N 21/3504* | (2014.01) | |

(Continued)

(52) U.S. Cl.
CPC ............ *G06F 30/20* (2020.01); *G01J 1/0433* (2013.01); *G01J 3/0294* (2013.01); *G01J 3/28* (2013.01); *G01J 3/42* (2013.01); *G01J 3/44* (2013.01); *G01N 21/3504* (2013.01); *G01N 21/39* (2013.01); *G01N 21/65* (2013.01); *G06F 17/10* (2013.01); *G01N 2021/3545* (2013.01);

(Continued)

(58) Field of Classification Search
None
See application file for complete search history.

(56) References Cited

U.S. PATENT DOCUMENTS

| | | |
|---|---|---|
| 2,690,695 A | 10/1954 | Coates |
| 3,614,243 A | 10/1971 | Harvey |

(Continued)

FOREIGN PATENT DOCUMENTS

| | | |
|---|---|---|
| CN | 101825567 A | 9/2010 |
| CN | 103210301 A1 | 7/2013 |

(Continued)

OTHER PUBLICATIONS

"In-Situ Sensors for the Chemical Industry—Final Report", project report of "Development of In Situ Analysis for the Chemical Industry", the Dow Chemical Company, Principle investigator: Dr. J.D. Tate, project No. DE-FC36-o21D14428, pp. 1-37, Jun. 30, 2006.

(Continued)

*Primary Examiner* — Brian W Wathen
*Assistant Examiner* — Abdou K Seye
(74) *Attorney, Agent, or Firm* — Christopher R. Powers; PatServe

(57) ABSTRACT

Background composition concentration data representative of an actual background composition of a sample gas can be used to model absorption spectroscopy measurement data obtained for a gas sample and to correct an analysis of the absorption spectroscopy data (e.g. for structural interference and collisional broadening) based on the modeling.

18 Claims, 6 Drawing Sheets

(51) Int. Cl.

| | | |
|---|---|---|
| *G06F 17/10* | (2006.01) | |
| *G01J 3/42* | (2006.01) | |
| *G01J 3/44* | (2006.01) | |
| *G01J 1/04* | (2006.01) | |
| *G01J 3/28* | (2006.01) | |
| *G01J 3/02* | (2006.01) | |

(52) U.S. Cl.
CPC ............. *G01N 2021/399* (2013.01); *G01N 2201/0612* (2013.01); *G01N 2201/129* (2013.01)

(56) References Cited

U.S. PATENT DOCUMENTS

| | | |
|---|---|---|
| 3,723,731 A | 3/1973 | Blau, Jr. |
| 3,810,695 A | 5/1974 | Shea |
| 4,829,183 A | 5/1989 | McClatchie et al. |
| 4,953,390 A | 9/1990 | Krempl et al. |
| 5,026,991 A | 6/1991 | Goldstein et al. |
| 5,107,118 A | 4/1992 | Murray, Jr. et al. |
| 5,268,736 A | 12/1993 | Prather |
| 5,528,040 A | 6/1996 | Lehmann |
| 5,572,031 A | 11/1996 | Cooper et al. |
| 5,657,126 A | 8/1997 | Ducharme et al. |
| 5,742,053 A | 4/1998 | Rekunyk |
| 5,760,895 A | 6/1998 | Kebabian |
| 5,777,329 A | 7/1998 | Westphal et al. |
| 5,847,392 A | 12/1998 | Van Den Berg et al. |
| 5,880,850 A | 3/1999 | McAndrew et al. |
| 5,958,340 A | 9/1999 | Meyer et al. |
| 5,963,336 A | 10/1999 | McAndrew et al. |
| 6,064,488 A | 5/2000 | Brand et al. |
| 6,147,351 A | 11/2000 | Huiku |
| 6,188,475 B1 | 2/2001 | Inman et al. |
| 6,292,756 B1 | 9/2001 | Lievois et al. |
| 6,353,225 B1 | 3/2002 | Strzoda et al. |
| 6,420,695 B1 | 7/2002 | Grasdepot et al. |
| 6,422,056 B1 | 7/2002 | Miyai et al. |
| 6,519,039 B1 | 2/2003 | Morishita et al. |
| 6,657,198 B1 | 12/2003 | May |
| 6,762,836 B2 | 7/2004 | Benicewicz et al. |
| 6,841,781 B2 | 1/2005 | Toomey |
| 7,116,422 B2 | 10/2006 | Larking et al. |
| 7,132,661 B2 | 11/2006 | May |
| 7,166,843 B2 | 1/2007 | May |
| 7,176,464 B2 | 2/2007 | Oka et al. |
| 7,193,718 B2 | 3/2007 | Lundqvist et al. |
| 7,228,017 B2 | 6/2007 | Xia et al. |
| 7,508,521 B2 | 3/2009 | Liu et al. |
| 7,704,301 B2 | 4/2010 | Zhou et al. |
| 7,819,946 B2 | 10/2010 | Zhou et al. |
| 8,152,900 B2 | 4/2012 | Zhou et al. |
| 2002/0190840 A1 | 12/2002 | Fujita et al. |
| 2003/0213912 A1 | 11/2003 | Tulip |
| 2004/0034480 A1 | 2/2004 | Binder |
| 2004/0079887 A1 | 4/2004 | May |
| 2006/0011844 A1 | 1/2006 | Oka et al. |
| 2006/0109470 A1 | 5/2006 | May |
| 2006/0163483 A1 | 7/2006 | Chabanis et al. |
| 2006/0176486 A1 | 8/2006 | Ho |
| 2006/0192967 A1 | 8/2006 | Kluczynski |
| 2007/0246653 A1 | 10/2007 | Zhou |
| 2008/0179530 A1* | 7/2008 | Liu .............. G01N 21/274 250/343 |
| 2010/0090845 A1 | 4/2010 | Polak et al. |
| 2012/0065948 A1* | 3/2012 | Tan .................. G01J 3/28 703/2 |
| 2012/0105827 A1 | 5/2012 | Carter et al. |
| 2012/0122084 A1* | 5/2012 | Wagner ........... C12N 5/0612 435/6.1 |
| 2013/0250301 A1 | 9/2013 | Feitisch et al. |

FOREIGN PATENT DOCUMENTS

| | | |
|---|---|---|
| CN | 103454379 A | 12/2013 |
| DE | 3413914 A1 | 10/1985 |
| DE | 3619301 A1 | 12/1987 |
| EP | 0768523 A2 | 4/1997 |
| EP | 922908 A1 | 6/1999 |
| GB | 2416205 A | 1/2006 |
| GB | 2429279 A | 2/2007 |
| WO | WO-03/100393 A1 | 12/2003 |
| WO | WO-2005/047872 A1 | 5/2005 |
| WO | WO-2005/078412 A1 | 8/2005 |

OTHER PUBLICATIONS

Daewoong Hong et al. "Improved Methods for Performing Multivariate Analysis and Deriving Background Spectra in Atmospheric Open-Path FT-IR Monitoring." Applied Spectroscopy. vol. 57, No. 3, Mar. 1, 2003 (Mar. 1, 2003), pp. 299-308.

\* cited by examiner

TARGET ANALYTE DETECTION AND QUANTIFICATION IN SAMPLE GASES WITH COMPLEX BACKGROUND COMPOSITIONS

CROSS-REFERENCE TO RELATED APPLICATIONS

The subject matter described herein is related to co-pending U.S. application publication no. 2013/0250301A1 and to issued U.S. Pat. Nos. 7,508,521, and 7,704,301, each of which is co-owned by the assignee of this application, and each of which is incorporated herein by reference.

TECHNICAL FIELD

The subject matter described herein relates to compensation for the effects of collisional broadening and spectral interferences from background stream gases on measurements, for example for detection and/or quantification of trace gases, made by spectroscopic analyzers.

BACKGROUND

Spectroscopic analysis generally relies on detection and quantification of emission or absorption of radiation by matter. The radiation is absorbed or emitted with a particular energy determined by transitions occurring to the molecules of an analyte. For example, in infrared spectroscopy, discrete energy quanta are absorbed by molecules due to excitation of vibrational or rotational transitions of the intra-molecular bonds. The collision of other molecules in a gas mixture with the emitting or absorbing molecules and the collision between the emitting or absorbing molecules themselves can perturb the energy levels of the emitting or absorbing molecules and therefore cause broadening of the emission or absorption line shape. Collisional broadening of spectral line shapes can depend on any or all of the pressure, temperature, and composition of the gas mixture in addition to the spectral transition and concentration of a particular target analyte. Furthermore, absorption of the discrete energy quanta by components of a sample gas other than the target analyte can also structurally interfere with the measured emission or absorption line shape. Quantitative measurement errors can occur if the spectroscopic analyzer is used to measure a target analyte in a sample gas having one or more of a pressure, a temperature, and a background composition (e.g. concentrations of other compounds in the sample gas than the target analyte) that differ from the gas mixture used to calibrate the analyzer. These errors have been found to be a substantial challenge for optical measurement of trace level impurities (e.g. less than approximately 10,000 ppm) in natural gas quality control, petrochemical production, quality control and environmental emissions control, and the like, but is not limited to those applications.

SUMMARY

Implementations of the current subject matter can provide one or more advantages. For example, background composition concentration data representative of an actual background composition of a sample gas can be used to model absorption spectroscopy measurement data obtained for a gas sample and to correct an analysis of the absorption spectroscopy data based on the modeling. In some non-limiting examples, the background composition concentration data can be generated through Raman spectroscopy analysis of the sample gas to provide identification and quantification of the component compounds of the sample background, thereby allowing for accurate compensation of collisional broadening and spectral interference. Application of Raman spectroscopy as described herein can establish calibration fidelity of a spectroscopic analyzer, even with a changing background composition of the gas being sampled. This capability can constitute a significant advance, for example with harmonic spectroscopy, in which trace analyte quantification can be impacted by reading offsets caused by collisional broadening, structural interference, and other effects that are generally difficult or even impossible to accurately model, particularly in sample gases having a varying background composition.

In one aspect, a method includes modeling absorption spectroscopy measurement data obtained for a gas sample as one or more functions of a background composition of the gas sample. The modeling includes generating mathematical representations of structural interference and/or collisional broadening effects based on background composition concentration data representative of an actual background composition of the gas sample. The method further includes applying one or more multivariate regression analysis algorithms to correct, based on the modeling, an analysis of the absorption spectroscopy data, which are obtained by a second analysis approach comprising absorption spectroscopy, and determining a target analyte concentration in the gas sample based on the corrected analysis of the absorption spectroscopy data obtained by the second analysis approach.

Systems and methods consistent with this approach are described as well as articles that comprise a tangibly embodied machine-readable medium operable to cause one or more machines (e.g., computers, etc.) to result in operations described herein. Similarly, computer systems are also described that may include a processor and a memory coupled to the processor. The memory may include one or more programs that cause the processor to perform one or more of the operations described herein.

For example, in an interrelated aspect, a computer program product includes a computer-readable medium storing instructions that, when executed by at least one programmable processor, cause the at least one programmable processor to perform operations that include modeling absorption spectroscopy measurement data obtained for a gas sample as one or more functions of a background composition of the gas sample. The modeling includes generating mathematical representations of structural interference and/or collisional broadening effects based on background composition concentration data representative of an actual background composition of the gas sample. The operations further include applying one or more multivariate regression analysis algorithms to correct, based on the modeling, an analysis of the absorption spectroscopy data, which are obtained by a second analysis approach comprising absorption spectroscopy, and determining a target analyte concentration in the gas sample based on the corrected analysis of the absorption spectroscopy data obtained by the second analysis approach.

In another interrelated aspect, a system includes computer hardware configured to perform operations that include modeling absorption spectroscopy measurement data obtained for a gas sample as one or more functions of a background composition of the gas sample. The modeling includes generating mathematical representations of structural interference and/or collisional broadening effects based on background composition concentration data representative of an actual background composition of the gas sample. The operations further include applying one or more multivariate regression analysis algorithms to correct, based on the modeling, an analysis of the absorption spectroscopy data, which are obtained by a second analysis approach comprising absorption spectroscopy, and determining a target analyte concentration in the gas sample based on the corrected analysis of the absorption spectroscopy data obtained by the second analysis approach.

In optional variations, one or more of the following features can be included in any feasible combination. A system can optionally include a Raman spectroscopy subsystem, and an absorption spectroscopy subsystem for executing the second analysis approach. The Raman spectroscopy subsystem and the absorption spectroscopy subsystem can be configured to obtain Raman spectral data and the absorption spectroscopy data on a same gas sample, or optionally on different gas samples. The Raman spectroscopy subsystem can include an in situ probe configured to obtain the Raman spectral data from within a gas source, and the system can include a gas sampling system for extracting the gas sample from the gas source substantially concurrently, optionally sequentially, with the obtaining of the Raman spectral data by the probe.

With regard to operations of a method or that are performed by computer hardware, programmable processors, and the like, as well as instructions for performing such operations, the actual background composition can include a plurality of chemical species whose concentrations in the gas sample vary sufficiently between over time to cause variation in the determined target analyte concentration if the one or more multivariate regression analysis algorithms are not applied to correct the analysis of the absorption spectroscopy data obtained by the second analysis approach. The background composition concentration data can include data obtained by a first analysis approach, the first analysis approach comprising at least one of Raman spectroscopy, gas chromatography, gathering of concentration and/or other physical data from a distributed control system or a supervisory control and data acquisition system, nuclear magnetic resonance spectroscopy, Fourier transform infrared spectroscopy, direct absorption spectroscopy, emission spectroscopy, and nondispersive infrared spectroscopy.

The background composition concentration data can include Raman spectral data obtained by a first analysis approach that can include Raman spectroscopy. The Raman spectroscopy can be performed on a same gas sample as the second analysis approach, or optionally on a different sample. The absorption spectroscopy data can be obtained substantially simultaneously to the Raman spectral data, or optionally sequentially with (e.g. before or after) the Raman spectral data. The Raman spectral data can be obtained in situ on a gas within a gas source, and the gas sample for use in the second analysis approach can be extracted from the gas source substantially concurrently with the obtaining of the Raman spectral data.

A temperature and/or a pressure of the gas sample can be determined based on the Raman spectral data. The Raman spectral data can include measurements over wavenumbers indicative of one or more of: hydrocarbon species, hydrogen gas ($H_2$), nitrogen gas ($N_2$), oxygen gas ($O_2$), chlorine gas ($Cl_2$), carbon dioxide ($CO_2$), carbon monoxide ($CO$), ammonia ($NH_3$), hydrogen-sulfide ($H_2S$), sulfur compounds, fluoro-carbons, chloro-carbons, hydro-fluoro-carbons, hydro-fluoro-chloro-carbons, and hydro-chloro-carbons. The sample gas can include hydrocarbon gases. The one or more target analyte can include at least one of acids, bases, hydrogen sulfide ($H_2S$), other sulfur compounds, hydrogen chloride ($HCl$), hydrogen fluoride ($HF$), hydrogen bromide ($HBr$), other acids, water or water vapor ($H_2O$), hydrogen cyanide ($HCN$), ammonia ($NH_3$), arsine ($AsH_3$), phosphine ($PH_3$), oxygen ($O_2$) carbon monoxide ($CO$), carbon dioxide ($CO_2$), methane ($CH_4$), ethane ($C_2H_6$), ethene ($C_2H_4$), ethylene ($C_2H_2$), other hydrocarbons, hydro-fluoro-carbons, hydro-chloro-carbons, and hydro-fluoro-chloro-carbons. The second analysis approach can include at least one of tunable diode laser absorption spectroscopy, tunable semiconductor laser absorption spectroscopy, and infrared spectroscopy using filter-based and/or grating-based light sources.

The details of one or more variations of the subject matter described herein are set forth in the accompanying drawings and the description below. Other features and advantages of the subject matter described herein will be apparent from the description and drawings, and from the claims. It should be noted that the current subject matter contemplates both a flowing sample gas stream and a static sample gas from which a sample gas volume can be withdrawn. The term "sample gas volume" or "gas volume" as used herein therefore refers to either a flowing volume or a static, batch volume of gas.

DESCRIPTION OF DRAWINGS

The accompanying drawings, which are incorporated in and constitute a part of this specification, show certain aspects of the subject matter disclosed herein and, together with the description, help explain some of the principles associated with the disclosed embodiments. In the drawings.

DETAILED DESCRIPTION

Figure 1:
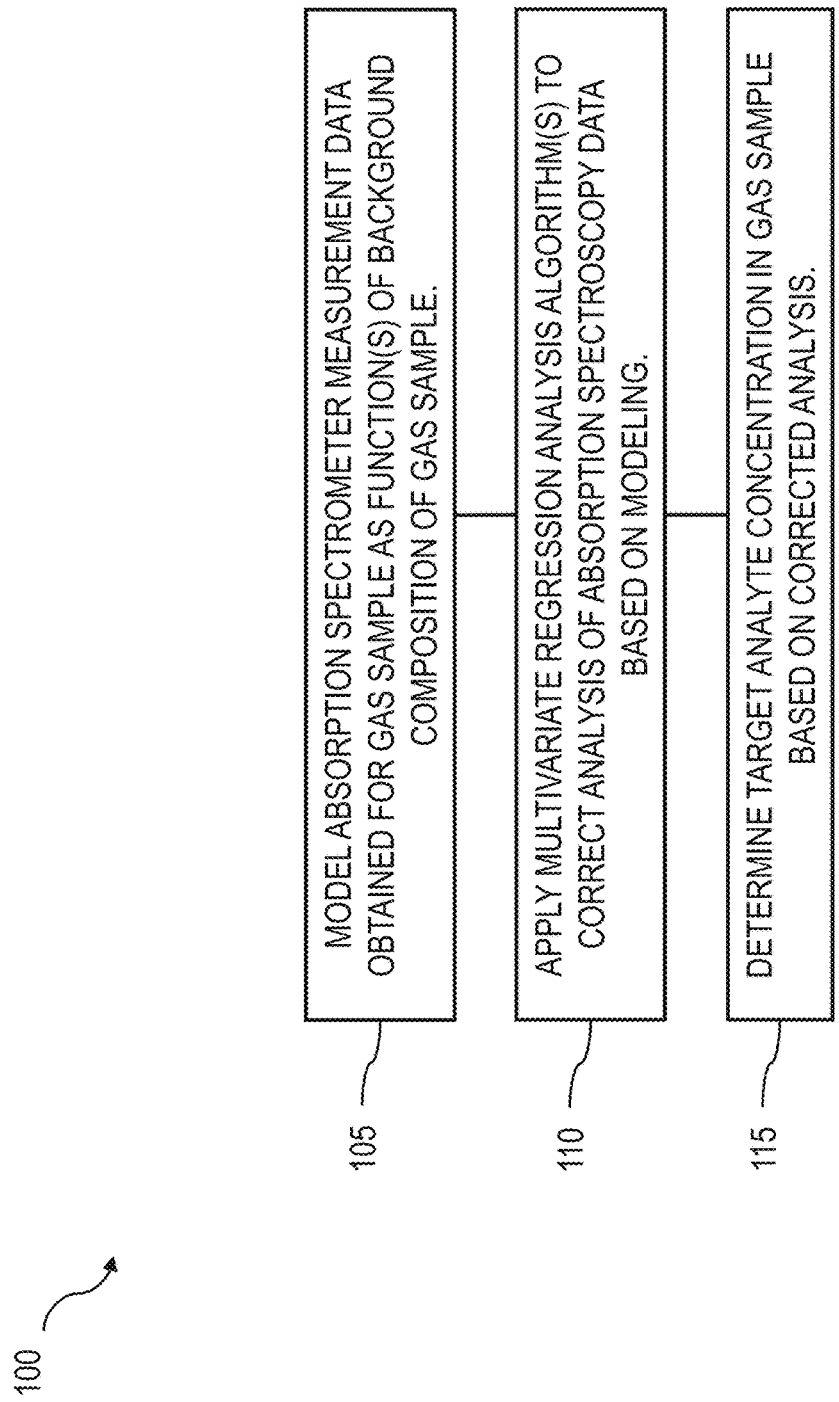
FIG. 1 shows a process flow diagram illustrating features of a method consistent with implementations of the current subject matter.

Various approaches can be applied to compensate for collisional broadening caused by differences in pressure and temperature during quantitative analysis of target analyte concentrations from one sample gas to another. For example, the pressure and/or temperature of a sample gas can be maintained sufficiently close to a calibration gas pressure and/or temperature by proper sample conditioning, including pressure regulation and temperature stabilization of the sample gas. In another example, real time measurement of pressure and temperature can be used to compensate for collisional broadening changes by applying theoretical and/or empirical models, including but not limited to polynomial corrections, pressure temperature matrixes, chemometrics, experimental calibrations, and the like. In another example, parameters of the spectroscopic measurement (e.g. the harmonic modulation parameters) can also be adjusted in real time to compensate for line shape broadening due to changes in sample gas pressure. An example of such an approach is described in co-owned U.S. Pat. No. 7,508,521 and in co-owned and co-pending U.S. application publication no. 2013/0250301A1.

Various techniques can be used to monitor the composition of gases such as fuels and flue gases in real time. Absorption spectroscopy, such as for example tunable diode laser absorption spectroscopy (TDLAS), or in more general terms tunable laser absorption spectroscopy (TLAS), which also includes use of quantum cascade and intraband cascade lasers (QCL and ICL), can be a robust measurement approach capable of accurately and quickly quantifying target analyte concentrations over a broad concentration range. Spectroscopic systems that employ TDLAS to identify one or more analytes of interest in a gas mixture can require adjustment while in use for a variety of reasons, which can include changes in the composition (e.g. relative amounts and/or presence or absence of one or more chemical species) of the gas mixture over time. Gas mixture composition changes can result in changes in collisional broadening effects, structural spectral interferences, and the like, which can affect the measured absorptive properties of the target analyte(s) and/or the other chemical species present in the background composition of the gas mixture. Methods to correct for a changing composition from sample to sample of a gas mixture can include physical compensation methods and software-based compensation methods.

In general, currently available approaches do not provide experimental or theoretical compensation of spectral line shape changes caused by collision of the target analyte molecules with other molecules in a gas sample having different mass and structure, in particular when sequential gas samples contain differing background gas compositions (and therefore a differing mixture of other molecules having a difficult to quantify effect on the spectral line shape of a target analyte). Compensating for spectral line shape changes caused by changing background sample gas composition can be important for harmonic spectroscopy approaches, which have been demonstrated for reliable measurements of target analyte concentrations below approximately 10,000 ppm and in sample gases in which absorption by other compounds present in the sample gas can spectrally interfere with accurate measurement of absorption attributable to one or more target analytes.

Direct absorption spectroscopy approaches can be used for measurement of target analyte concentrations exceeding approximately 10,000 ppm and in background gas mixtures whose compositions include little or substantially no interfering absorption at the wavelength of the target analyte spectral line. Integration over some or all of the line shape of the target analyte spectrum can provide a quantitative target analyte concentration, which is proportional to the area of the spectral line shape but does not depend upon the line shape itself. However, direct absorption measurements may not be able to accurately quantify very low concentrations (e.g. less than 10,000 ppm) of many target analytes, in particular when overlap occurs between spectroscopic features of background species in a gas sample and those of the target analyte. Furthermore, direct absorption measurements may not be able to quantify the target analyte when compounds, which spectrally interfere with the target analyte absorption, occur in the gas sample.

An example of a physical compensation method is described in co-owned U.S. Pat. No. 7,704,301 and includes removal (or at least reduction in the concentration) of one or more analytes of interest to create a scrubbed gas sample containing the background species. An absorption spectrum obtained from the scrubbed gas sample is then subtracted from a spectrum obtained from an unscrubbed sample. However, physical compensation approaches such as this may not be sufficient to fully compensate for effects from collisional broadening, particularly if the sample gas background composition varies sufficiently over time to preclude compensation for collisional broadening, structural interference, other effects that can create shifts or offsets affecting calculations of trace analyte concentrations, and the like in the sample gas based on a characterization of the background composition from a limited number of samples.

Software-based compensation methods for correcting for a changing background composition between gas samples can include using software or other computer-implemented approaches to mathematically decompose one or more measured absorption spectra from the gas mixture into individual spectra from the one or more analytes of interest and background species, using an algorithm that includes chemometrics to model structural interference and some of the collisional broadening effect, and modeling absorption spectrometer outputs (e.g. signals from one or more photodetectors upon which light emitted from a light source and passing through a gas sample impinges) as one or more functions of the background species in a gas mixture when the background species are known. However, modeling of structural interference and/or collisional broadening can lead to computational difficulties in converging to a solution due to the large number of unknown variables.

When the background composition of a gas sample is known or well-characterized, modeling of absorption spectrometer measurement data as one or more functions of the background composition can generate mathematical representations of structural interference and the collisional broadening effect. A multivariate regression analysis (MVR) algorithm can be used to correct analysis of absorption spectra, including TDLAS spectra, under such conditions. In some implementations of the current subject matter, background composition concentration data representative of the actual background composition of a gas sample can be used as an input for the aforementioned modeling. These background composition concentration data can originate through one or more of a variety of approaches. For example, background composition concentration data can be based on determinations or calculation of the background composition using a first analysis approach that differs from the absorption spectroscopy-based approach used for quantifying the trace analyte. In some examples, the first analysis approach from which the background composition concentration data originates can be an approach other than a harmonic spectroscopy, TDLAS-based approach. Examples of first analysis approaches other than an absorption spectroscopy-based approach that can be useful in deriving or generating background composition concentration data representative of the actual background composition of a gas sample can include, but are not limited to one or more of Raman spectroscopy, gas chromatography (GC), gathering of concentration and/or other physical data (pressure, temperature, etc.) from a distributed control system or a supervisory control and data acquisition (SCADA) system, Fourier transform infrared (FTIR) spectroscopy, nondispersive infrared (NDIR) spectroscopy, direct absorption spectroscopy, emission spectroscopy, nuclear magnetic resonance spectroscopy (NMR), and the like.

In addition, one or more sets of background composition concentration data can be accessed from a data store, which can include accessing a local storage device or a networked storage device to select a predetermined set of background composition concentration data from multiple sets of background composition concentration data. The selection can be based on one or more optical or other empirical measurements of one or more parameters relating to the gas sample. For example, one of the measurements noted herein (or other measurements) can be used as a selection variable to determine which of multiple possible background composition concentration data sets is expected to best characterize the background composition concentration of the current sample gas. In this manner, a subset of the chemical species that make up the background composition of a gas sample can be detected and their concentrations can be quantified using a first analysis approach. Using the quantification of the concentrations of the subset of the chemical species, a predetermined set of background composition concentration data can be selected to best match the available measurement from the first analysis approach. The subset of the chemical species can include at least one of the chemical species that makes up the background composition and can optionally include two, three, four, five, or more chemical species.

The background composition concentration data can optionally include either or both of background absorption data and concentration data. In the example of the background composition concentration data including background absorption data, the background absorption data can be converted to concentration values, optionally using one or more conversion factors.

In some implementations of the current subject matter, the first analysis approach can include use of measurements from a Raman spectrometer and/or other sampling approaches to identify and measure the overall background composition of a gas sample being analyzed. In-the-field identification of background components using Raman spectroscopy can be used in conjunction with systems that detect and/or quantify a concentration of one or more trace analytes in a gas mixture that includes a complex and/or varying background of other compounds whose spectral absorbance characteristics may or may not overlap with those of the trace analyte(s). As noted above, a gas sample can include one or more analyte compounds. Detection and/or quantification of the concentration of such analyte compounds can be performed by spectroscopic analysis. To compensate for the effects of collisional broadening on the results of the spectroscopic analysis, implementations of the current subject matter can make use of data from a first analysis approach, such as for example Raman spectral data, to quantify the make-up of the bulk of a gas sample (e.g. the presence and concentration of chemical species that constitute all or at least some of the background composition of the gas sample) so that a model refining the absorption spectrometer data can be generated. This model can be used to improve identification and/or quantification of the one or more analyte compounds in the gas mixture.

Target analyte compounds with which implementations of the current subject matter can be used include, but are not limited to, hydrogen sulfide ($H_2S$), other sulfur compounds, hydrogen chloride (HCl), hydrogen fluoride (HF), hydrogen bromide (HBr), other acids, water or water vapor ($H_2O$), hydrogen cyanide (HCN), ammonia ($NH_3$), arsine ($AsH_3$), phosphine ($PH_3$), oxygen ($O_2$) carbon monoxide (CO), carbon dioxide ($CO_2$), methane ($CH_4$), ethane ($C_2H_6$), ethene ($C_2H_4$), ethylene ($C_2H_2$), other hydrocarbons, hydro-fluoro-carbons, hydro-chloro-carbons, hydro-fluoro-chloro-carbons, and the like.

FIG. 1 shows a process flow chart 100 illustrating features of a method including features consistent with implementations of the current subject matter. At 105, absorption spectrometer measurement data obtained for a gas sample are modeled as one or more functions of a background composition of the gas sample. The modeling includes generating mathematical representations of structural interference and/or collisional broadening effects based on background composition concentration data representative of an actual background composition of the gas sample, for example using one or more multivariate regression analysis algorithms. At 110, the one or more multivariate regression analysis algorithms are applied to correct analysis of absorption spectroscopy data based on the modeling, and at 115 a target analyte concentration in the gas sample is determined based on the corrected analysis. The background composition concentration data can be generated by a first analysis approach, and the absorption spectroscopy data can be generated by a second analysis approach that differs from the first analysis approach and that includes absorption spectroscopy. The second analysis approach can advantageously include tunable diode laser absorption spectroscopy (TDLAS), but can also include other absorption spectroscopy approaches, such as for example tunable semiconductor laser absorption spectroscopy (e.g. using quantum cascade lasers, intra-band cascade lasers, and the like), filter-based and grating-based infrared spectroscopy approaches using spectrally broader light sources than lasers, etc.

The actual background composition can include a plurality of chemical species whose concentrations in the gas sample vary sufficiently over time to cause variation in the determined target analyte concentration if the one or more multivariate regression analysis algorithms are not applied to correct the analysis of the absorption spectroscopy data obtained by the second analysis approach. Concentrations that vary sufficiently over time can generally refer to changes in the background chemical species concentrations that result in structural spectral interference or collisional broadening effects that influence the determined target analyte concentration by more than 10%, or in some implementations of the current subject matter by more than 5%. In some implementations of the current subject matter, a sufficient variation in background species concentration can be based on limits imposed by a specification of the absorption spectroscopy analyzer, which can be approximately ±2% or approximately ±1% of a measurement value or of a measurement range, as per published specifications.

Figure 2:
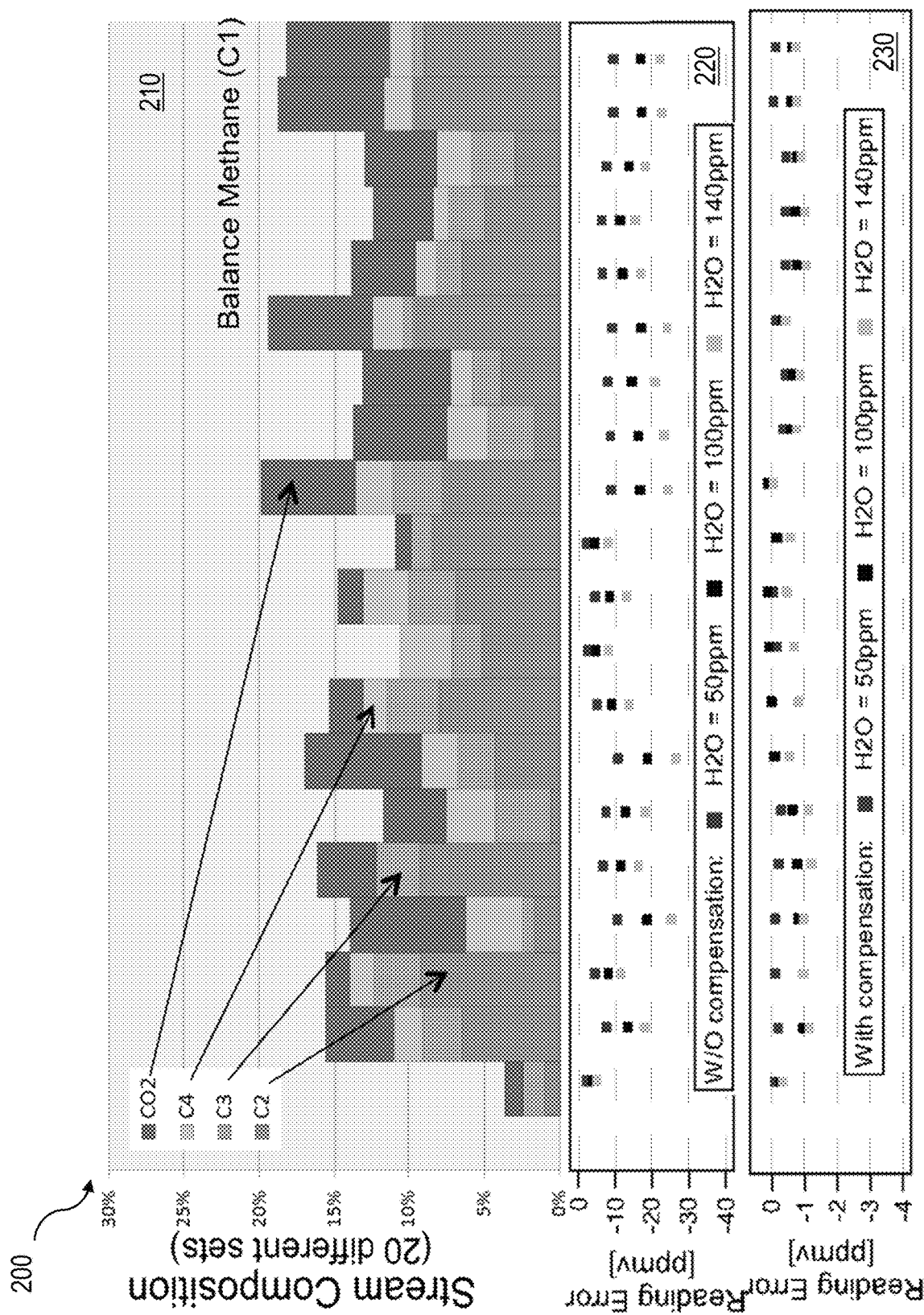
FIG. 2 shows a chart illustrating variability in water vapor concentrations determined using a TDLAS in a synthesize natural gas mixture and reduction in errors that can result from use of implementations of the current subject matter.

In some implementations of the current subject matter involving sample gases in which strong spectral structural interferences occur, variations in background species concentrations as low as approximately 1%, approximately 0.5%, approximately 0.1%, or approximately 0.05% can cause the determined analyte concentration to deviate materially (e.g. resulting in an offset outside of specifications) from its calibration value. As an example, measurement of water vapor at less than approximately 1000 ppm levels in natural gas can be offset outside of specification ranges by variations in $CO_2$ concentration of less than approximately 0.5%. FIG. 2 shows a chart 200 that illustrates experimentally observed effects of changes in the background composition of a synthesized natural gas mixture (an example of sample gas) on a concentration of water vapor ($H_2O$) in the sample gas as determined by a tunable diode laser spectrometer. The upper pane 210 of the chart 200 shows the difference in amount of carbon dioxide ($CO_2$); methane; and C2, C3, and C4 hydrocarbons throughout a plurality of gas samples. The middle pane 220 shows the variability in water vapor measurements with a TDLAS spectrometer for the various background gas compositions without correction consistent with implementations of the current subject matter, and the bottom pane 230 shows the variability in water vapor measurements with the TDLAS spectrometer for the various background gas compositions with use of a MVR algorithm based on known background composition data for the gas samples. As FIG. 2 illustrates, there is significantly less variability (e.g. errors) in the data corrected consistent with implementations of the current subject matter.

Use of Raman spectroscopy or other analytical approaches as a first analysis approach in conjunction with a second analysis approach that includes absorption spectroscopy (which can optionally include TDLAS) to characterize a gas mixture can allow for improved accuracy of identification and quantification of a target analyte, a reduction in system (e.g., hardware and/or software) complexity, and improved system robustness. Illustrative, non-limiting examples of how such improvements and/or other advantages may be achieved by some implementations of the current subject matter are explained in greater detail in the following paragraphs.

Simplification of the software and supporting hardware needed for analysis can be achieved when background composition concentration data representative of an actual background composition of the gas sample is used to provide background composition information for use in correcting the data from the second analysis approach to determine a target analyte concentration in the gas sample. In the absence of this background composition concentration data, various multivariate analysis approaches may be used to give context to at least a part of the collected absorption spectrum, in addition to identifying the one or more target analyte. However, such approaches can be highly dependent on chemometrics or other multivariate analysis methods to separate spectrally overlapping chemical species that make up the background composition of the gas sample. Putting some or all of the collected absorption spectrum in context using only absorption data (e.g. data obtained form the second analysis approach) can be computationally intense and complex. Use of background composition concentration data obtained from the first analysis approach (e.g. from Raman spectroscopy) can greatly reduce the computations needed because context is already provided by the background species identified and quantified in the background composition concentration data. Giving the spectrum context can include at least roughly identifying the peaks and the range of wavelengths the spectrum should cover, as well as locating potential peaks of interest, such as those of the background species and analyte species.

Performance of an analytical system can be improved over current absorption analysis systems in terms of reduced complexity, increased calibration fidelity, and increased speed of analysis. The system hardware can be simplified because physical removal of the analytes of interest, such as by scrubbing, is not needed to provide a reliable background spectrum. Additionally, use of a separate first analysis approach (such as for example Raman spectroscopy) can allow background composition concentration data to be acquired quickly such that an analytical system implementing the second analysis approach can make real time (or at least nearly real-time) corrections to absorption spectra.

Gas chromatograph data may be slow to update, on the order of minutes or longer, and may generally not be able to keep pace with real time or near real time absorption measurements from a second analysis approach (e.g. TDLAS spectrum measurements), Furthermore, other currently used optical analysis methods, such as NDIR and FTIR cannot resolve symmetric diatomic molecules (e.g., $H_2$, $N_2$, $O_2$, $Cl_2$) in gas samples as well as Raman spectroscopy. However, use of GC analysis and/or NDIR, FTIR, NMR, direct absorption spectroscopy, emission spectroscopy, or other such analysis approaches for quantifying certain background species in combination with other analytical approaches for identifying and quantifying other background species in a gas sample may provide background composition concentration data with sufficient rapidity. Accordingly, consistent with some implementations of the current subject matter, a first analysis approach for obtaining concentration data for a gas sample can include one or more of the approaches discussed in this paragraph and elsewhere in this application, as well as other approaches, optionally in combination, to generate the necessary background composition concentration data representative of an actual background composition of the gas sample. In some advantageous implementations of the current subject matter, the first analysis approach can include Raman spectroscopy, which can provide both a characterization of the concentrations of most or even all of the chemical species present in the background of the sample gas and a measurement of temperature and pressure of the gas sample.

Raman spectroscopy is a technique in which light interacts with the molecules of a sample to cause frequency shifts in the impinging light as it is scattered by the molecules of the sample. In some examples, filters are used to create a monochromatic light source from a white light source to improve spectral resolution of the scattered light and specificity of the Raman measurement. Alternatively, lasers or diodes that can emit light at a single or narrow band of frequencies can be used as a light source in a Raman spectroscopy system. Furthermore, narrow band filters such as various implementations of volume Bragg gratings and/or dielectric filters can be used to block the Rayleigh scattered light of the excitation light source so that Raman-shifted spectra can be measured with Stokes and Anti-Stokes lines which are shifted less than 200 $cm^{-1}$. Measurement of Anti-Stokes and Stokes lines of a sample gas can optionally be used to provide gas temperature information for correction of the TDLAS measurement. The vibrational state of the molecules of the sample cause corresponding frequency shifts in the light as it is scattered. A spectrometer that can resolve the intensity of the scattered light as a function of wavelength (inversely proportional to frequency) is used to determine Raman scattering data, including either or both of Stokes (shifts to lower frequency/longer wavelength) and anti-Stokes (shifts to higher frequency/shorter wavelength) scattering, in Raman spectroscopy systems. The Stokes and anti-Stokes Raman scattering data can be used to determine the temperature of the sample, as well as to indicate the vibrational energy states of the sample.

Variations of Raman spectroscopy can be used to identify chemical species in a gas sample with greater accuracy or certainty. Such variations include surface-enhanced Raman spectroscopy (SERS), resonance Raman spectroscopy, THz Raman spectroscopy, surface-enhanced resonance Raman spectroscopy (SERRS), angle-resolved Raman spectroscopy, spontaneous Raman spectroscopy, optical tweezers Raman spectroscopy, stimulated Raman spectroscopy, coherent anti-Stokes Raman spectroscopy, and the like. These variations can make use of additional or localized electrical fields, surface phenomenon, optical confinement, and the like.

A system that includes both a Raman spectroscopy subsystem (e.g. as a first analysis approach for providing background composition concentration data) and an absorption spectroscopy subsystem (e.g. a TDLAS subsystem or the like as a second analysis approach for providing spectral data capable of quantifying one or more target analytes in the gas sample) can be used to characterize a gas mixture in situ, with direct access to a gas stream from a gas source, or by characterizing discrete samples of a gas mixture. As used herein, a gas stream can include, but is not limited to, a natural gas pipeline, other high pressure pipelines, chemical process flows, Naphta crackers, petroleum processing flow streams, and the like.

The absorption spectroscopy subsystem can include an absorption spectrum acquisition component, as well as an analysis component. Similarly, the Raman spectroscopy subsystem can include a Raman spectrometer and an analysis component. The system can include a controller that, among other operations, dictates the frequency of characterization of the gas mixture, including the passing of data from the Raman spectroscopy subsystem to the absorption subsystem. The controller can include a computing unit (e.g. a programmable processor, specially purposed computing hardware or circuitry, combinations thereof, or the like) that includes components for data storage, data analysis, and data transmission, as well as a user interface for accepting user input. In some embodiments, the analysis component of the absorption subsystem and/or that of the Raman spectroscopy subsystem can be located on the controller.

The Raman scattering data, as Raman spectra and intensity from the spectroscopy system, can be used to determine the temperature of the sample and the chemical species in the sample, as well as concentration of the species in the sample when the Raman spectroscopy and absorption subsystems are properly calibrated. A system controller or an analysis component within the Raman spectroscopy subsystem can analyze the data obtained from Raman spectra to produce temperature and species information. That temperature and species information can be passed to the analysis component that processes the absorption data. The processing component can be part of system controller or part of the absorption spectroscopy system. The temperature and species information can be used to create or select an appropriate background spectrum to use with the absorption spectrum acquired by the absorption spectroscopy system so that one or more target analytes can be properly identified and quantified from the gas mixture.

The Raman spectroscopy subsystem can include a light source (e.g. a laser, which can be one of the examples listed above or another type of light source), a filter or other device that creates a sufficiently monochromatic beam of light, a spectrometer to resolve the wavelengths of light scattered, and a detector to record the intensity of light corresponding to each wavelength (and in turn wavenumber) over which light is scattered. The detector can include one or more of a charge-coupled device (CCD), a complementary metal oxide semiconductor (CMOS) device, a photomultiplier tube (PMT), a semiconductor photodetector, a multi-element detector or the like. The term sufficiently monochromatic as used in this context is understood to refer to light having a sufficiently narrow spectral width to allow accurate quantification of a Raman spectral data resulting from the light. In some implementations of the current subject matter, the light source of the Raman spectroscopy subsystem can be the same light source as that used in the absorption spectroscopy system, in part or in entirety. For example, the Raman spectroscopy subsystem can include a red light source, such as a He—Ne laser that produces an exciting light beam with a wavelength of 632.8 nm. The absorption spectroscopy subsystem can employ light with one or more wavelengths, one of which can optionally be 632.8 nm. In other implementations of the current subject matter, oxygen ($O_2$) spectral lines in the vicinity of 760.8 nm and 763.8 nm can be used. It will be readily understood that these examples of spectral wavelengths for Raman spectroscopy are not intended to be limiting, but are instead merely examples of possible exciting light beam wavelengths that can be used consistent with the current subject matter. Other exciting light wavelengths are also within the scope of the current subject matter.

The Raman spectroscopy subsystem can utilize one or more light sources, for example such that a single wavelength is used or such that each of multiple light source provides a wavelength that is best suited to the detection of a type of background species in the gas mixture. As mentioned above, in some illustrative examples, one light source can have a wavelength of about 632.8 nm and another light source can have a wavelength of about 405 nm, 450 nm, 488 nm, 510 nm, 532 nm, 650 nm about 761 nm, about 763 nm, about 785 nm, about 810 nm, 915 nm, about 980 nm, about 1064 nm, or greater than 1064 nm. The selection of wavelength is not limited to those mentioned herein. The one or more light sources can be selected to allow for an optimal signal from the analyte of interest, optimal signal from specific species in the background of the gas mixture, minimal fluorescence from the sample and optical system or all or some of these considerations. Optimization of the Raman excitation wavelength and spectrum signal can include minimizing noise from fluorescence of the sample or constituents of the sample. Peaks, or other distinct features, in Raman spectra for background elements in gas mixtures can be found at discrete Raman frequency shifts (typically specified in wavenumbers) or across a range of wavenumbers. For example, features corresponding to background species in a gas mixture can be found at about 250 $cm^{-1}$ to 3250 $cm^{-1}$ wavenumbers, the so called "fingerprint region" of the spectrum and at less than 250 $cm^{-1}$, the so called "THz region" of the spectrum, in Raman spectral data acquired from a gas sample.

The absorption spectroscopy subsystem can also include more than one light source, or a light source capable of, or configured to produce, light at more than one wavelength. The light sources for the Raman spectroscopy subsystem and the absorption spectroscopy subsystem can share components or even be the same light source. Exemplary types of light sources for the Raman and absorption spectroscopy subsystems can include one or more lasers, such as a tunable diode laser (TDL), a quantum cascade laser (QCL), an intra band cascade laser (ICL) a horizontal cavity laser, a vertical cavity surface emitting semiconductor laser (VCSEL), a distributed feedback laser (DFB), a distributed Bragg reflector laser (DBR), an amplified, including but not limited to trapezoidal amplifiers, DFB or DBR laser, a multi-element grating coupled DFB or DBR semiconductor laser, a gas discharge laser, a liquid laser, a solid state laser, a diode pumped solid state lasers (DPSS), an external cavity diode laser, an extended cavity diode laser, and the like. Other types of light sources can include one or more light emitting diodes (LEDs), lamps (e.g., incandescent, discharge, thermal), or other light sources that are optionally capable of generating sufficiently monochromatic light, such as through nonlinear optical interactions and/or spectral filtering.

The absorption spectroscopy subsystem light source can, in some implementations, operate at a spectrally very narrow wavelength substantially corresponding to a reactive gas absorption line where minimal absorption occurs by the background composition of the gas mixture, thereby minimizing the effects of interference due to the extremely high spectral purity of the laser (narrow line width). The light source can optionally be or include a laser, for example one emitting in the wavelength range between approximately 200 nm and 20,000 nm. In some examples, tunable diode lasers emitting light within the wavelength range from approximately 200 nm to 3000 nm and/or quantum cascade and intra-band cascade lasers emitting light in the wavelength range from approximately 3000 nm to 20,000 nm can be utilized. Alternatively or in addition, a spectrally narrow light source can be constructed by nonlinear difference and sum frequency mixing of suitable lasers. However, nonlinear frequency mixing may be optically complex and too expensive for practical commercial applications. Alternatively, a color center laser can be utilized, although such lasers are not always suitable for use in commercial field instrumentation due to their relatively large physical size, high power consumption, high maintenance requirements, need for cryogenic cooling, and cost.

The absorption spectroscopy subsystem light source can optionally be a single frequency or optionally a spectrally narrow (e.g. with a spectral width of less than approximately 1 $cm^{-1}$) diode laser or other light source that emits at the target wavelength and can optionally be scannable over a frequency or wavelength range in which a target wavelength for analysis of at least one target analyte is found. Other wavelengths at which a target analyte has a strong absorption line and the interference absorptions from other gas species in the background composition of the gas mixture, such as for example $CH_4$, $H_2O$, and $CO_2$, are relatively weaker can also be used. Alternatively, the light source can optionally be a quantum cascade laser or an intra-band cascade laser, or the like. In some variations, the wavelength of an absorption spectroscopy subsystem light source can be scanned across the target analyte absorption feature by varying the injection current while keeping the laser temperature constant. The laser temperature can in some implementations be controlled by placing the laser in intimate contact with a thermoelectric cooler (e.g. a Peltier cooler) whose temperature is measured with a thermistor and controlled by a feedback circuit.

Some systems described herein can allow for the Raman spectroscopy subsystem and the absorption spectroscopy subsystem to share components, including the light source or sources and the spectrometer. For example, the Raman spectroscopy subsystem and the absorption spectroscopy subsystem can share a laser as a light source, and the laser can operate at a slightly different frequency depending on the characterization technique, with the laser switching back and forth with each iteration of characterization of the gas mixture. Alternatively, or additionally, the Raman spectroscopy subsystem and the absorption spectroscopy subsystem can share a laser, but the laser can operate at a different frequency when operating in Raman spectroscopy mode versus absorption spectroscopy mode. Also, or in the alternative, the Raman spectroscopy subsystem and the absorption spectroscopy subsystem can share a spectrometer to resolve the intensity of light from the gas mixture sample that is either absorbed (e.g. in absorption spectroscopy mode) or scattered (e.g. in Raman spectroscopy mode) by directing the light from different sources through the gas sample and toward the shared spectrometer.

As discussed above, the Raman spectroscopy subsystem and the absorption spectroscopy subsystem each can have an associated analysis component. The Raman spectroscopy subsystem's analysis component can be configured to store not only Raman spectra and raw data, but also data that result from one or more analyses of the spectral data, such as for example the concentration of primary constituents of the sample, the sample temperature and pressure, etc. These data can be passed to the system controller and in turn provided to the absorption spectroscopy subsystem or a system analysis component (which can optionally execute on the controller) to produce corrected concentration values for the one or more target analytes.

Data, for example measurement data passing from either or both of the Raman spectroscopy subsystem and the absorption spectroscopy subsystem to the controller, can be transmitted via wired or wireless connections in various modes. Exemplary data transition modes include point-to-point, multipoint, networked, not networked, serial, parallel, simplex, half duplex, full duplex, and the like. Examples of wired connections can include digital, analog (e.g., 4/20), optical, and telephony modes of communication. Digital communication can be via RS-232, RA-422, RA-485, i2C, SPI, USB, Ethernet (e.g., industrial Ethernet), fieldbus, SWP, 1-wire, 2-wired, CAN, power line communication (PLC), IEC 1158-2, LVDS, UART, PWM, and the like. Optical connections can include fiber optic connections, free-space optical connections, such as IR (e.g., irDA), laser light, visible light, and the like. Telephony communication can include V.92, DSL, ISDN, T-carriers, and other signals transmitted over telephonic lines. Wireless connections can include radio frequency communication, WiFi, point-to-point radio, radio networks, Bluetooth, near field communication (NFC), cellular communication (e.g., GSM, CDMA, EDGE, UMTS-HSPA, HSPA+, LTE, WiMAX), inductive coupling, electromagnetic backscattering communication, and the like. Particular types of communication that can be part of the system include: Modbus, Profibus, DeviceNet, CANopen, SERCOS I/II, Foundation Fieldbus, AS-interface, IO-link, CompoNet, CC-Link, interbus, FIPIO, OPCN-I, FL-NET EPA, EtherCat, FFHI, FFHSE, HART, BA Cnet, Powerlink, Profinet, Modbus-RTU, Modbus-TCP, ControlNet, HSE, and the like.

Figure 3:
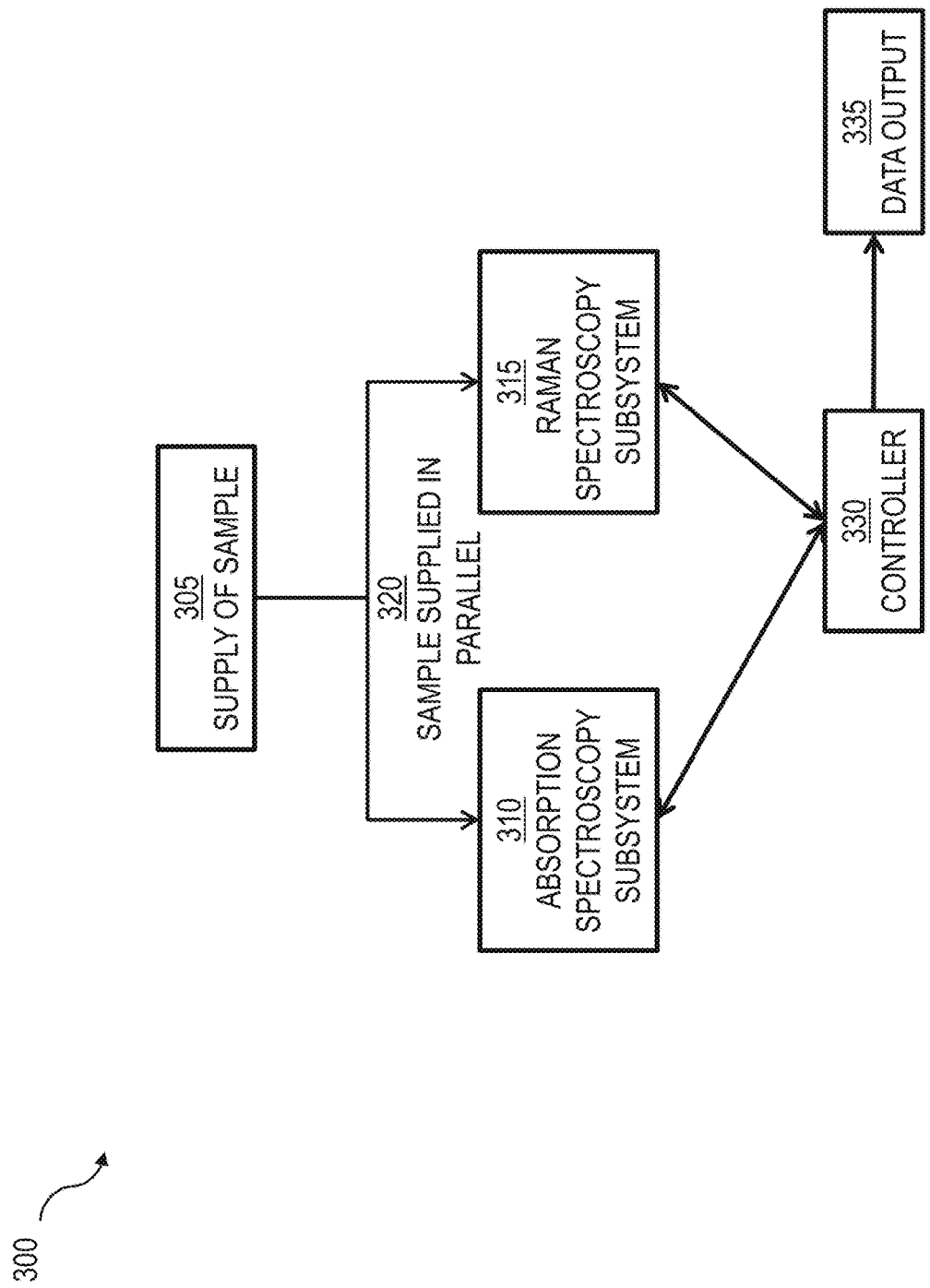
FIG. 3 shows a block diagram of an exemplary system for detection and quantification of at least one target analyte consistent with implementations of the current subject matter.

FIG. 3 shows a diagram illustrating features of an exemplary system 300 for analysis of a gas mixture, which includes a gas supply 305, an absorption spectroscopy subsystem (e.g. a TDLAS subsystem) 310, a Raman spectroscopy subsystem 315, a system controller 330, and a data output component 335. In FIG. 3, the gas mixture is provided to the absorption spectroscopy subsystem 310 and the Raman spectroscopy subsystem 315, optionally simultaneously 320, or at least close to (e.g. approximately) simultaneously. The degree to which the gas mixture is simultaneously supplied to the absorption spectroscopy subsystem 310 and the Raman spectroscopy subsystem 315 can be related to the level of variability in the background composition of the gas mixture.

Supplying the gas mixture to the absorption spectroscopy subsystem 310 and Raman spectroscopy subsystem 315 at least approximately simultaneously can be accomplished by having the systems analyzing the gas mixture in situ or by providing samples to the analysis subsystems at the same time (or close to the same time) from the same point in the gas supply (e.g., using one or more gas flow splitters, valves, and the like). It will also be understood that the term "simultaneously" can also be interpreted as approximately concurrently, in other words, closely correlated in time. For example, if different gas volumes captured or directed from a gas source to the Raman and absorption spectroscopy subsystems 310, 315 do not arrive at the respective subsystems for analysis at precisely the same time, but instead arrive with sufficient concurrency such that characterization of an overall composition of the gas mixture (e.g. inclusive of the amounts and presence or non-presence or various background compounds that are not the target analytes but that might interfere structurally or through collisional broadening effects) is sufficiently representative of the background composition present in the gas sample analyzed by the absorption spectroscopy subsystem, the Raman and absorption analyses can be said to occur at least approximately simultaneously.

The controller 330 can accept user input to dictate the frequency of analysis, parameters for analysis, and/or parameters for using the resulting data, particularly the concentration data for the one or more target analytes. The controller 330 can also provide the data from the Raman spectroscopy subsystem 315 to the analysis component that models the absorption data. The data output component 335 can provide composition and concentration data for the gas mixture to systems that control the flow, composition, treatment, or use of the gas mixture, or the data output component 335 can record or store and/or report the data to the user or an interested party, either by a local display or by other communication (e.g. wire or wireless) modes.

Figure 4:
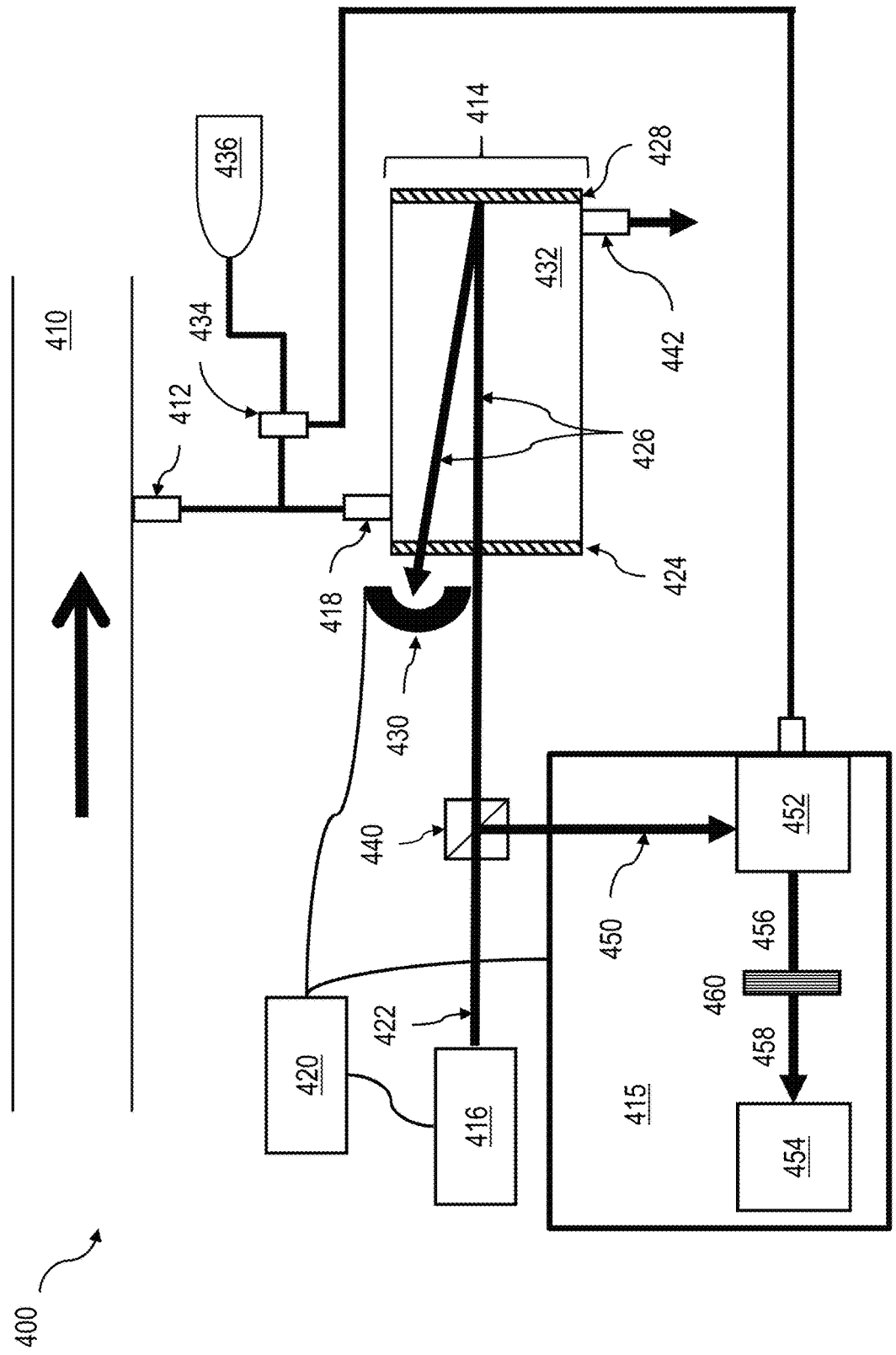
FIG. 4 is a diagram illustrating aspects of a system showing features consistent with implementations of the current subject matter.

FIG. 4 shows a diagram illustrating features of a system 400 for analysis of a gas mixture using Raman spectroscopy and absorption spectroscopy in parallel. As shown in FIG. 4, the system 400, includes a gas source 410, a sample extraction valve 412, an absorption cell 414, a Raman spectroscopy cell 415, a light source 416, and a controller 420. Gas enters the absorption cell 414 through a gas inlet 418, which can optionally include a valve.

The absorption cell 414 shown in FIG. 4 has an opening in a window 424 for accepting an incoming beam of light 422 from the light source 416, a mirror 428 for reflecting the light, and a detector 430. The absorption cell 414 has a volume 432 that is filled with the gas mixture to be analyzed during testing. The absorption cell 414 may be equipped with appropriate dimensions, the appropriate window 424, and an appropriate mirror 428 so that the path length 426 of exciting light through the cell 414 may yield sufficient signal for absorption spectroscopy when used with the detector 430. Gas passes out of the absorption cell 414 through a gas outlet 442, which can optionally include a valve.

The Raman spectroscopy cell 415 contains a Raman gas probe 452 and a spectrograph 454. A Raman gas probe 452 can utilize one of a variety of configurations for efficient generation and collection of Raman scattered light, including single or multiple focus, single or multiple pass, flow cell, capillary, etc. The Raman gas probe 452 can include a light source for illuminating the gas with the beam 450 from the beam splitter 440, and a collector for collecting the light 456 that is scattered from the gas. The collected scattered light passes through a filter 460 to block Rayleigh scattered light at the wavelength of the light source 416, and to thereby pass only the Raman-shifted wavelengths. The filter 460 can be a notch filter to pass both Stokes and anti-Stokes Raman, or a long-pass filter to pass only Stokes Raman, depending on the specific requirements of the application. The filter 460 can be necessary because the unshifted Rayleigh scatter is more intense than the Raman-shifted scatter of interest by a factor of approximately $10^8$. The filtered Raman light 458 is fed to a spectrometer 454 which separates and detects the shifted light components at different wavelengths to generate a Raman signature of the illuminated gas, which can be used to accurately identify and quantify the primary gas constituents.

In some implementations, such as that shown in FIG. 4, one light source 416 is used to generate a light beam 422 that is split by a beam splitter 440 so that some light is directed to the absorption cell 414 and some to the Raman cell 415. In such implementations, the Raman cell 415 may be able to utilize a light source with the same wavelength as the absorption cell 414. Alternatively, either the Raman cell 415 or the absorption cell 414 may have optical equipment, such as one or more filters, polarizers, lenses, and the like, that may process the incoming light 422 into a suitable beam of light for the analysis technique in the cell. In some cases, either or both cells can include optical equipment to adjust the incoming light 422.

The controller 420 may coordinate the emission of light from the light source 416 as well as the collection of data from the detector 430 and the Raman cell 415. The controller 420 can analyze the data, or the controller 420 may collect the data (and optionally store the data) and transmit it for analysis by another module.

The absorption cell 414 and Raman cell 415 may receive samples of the gas from the gas source 410 substantially (e.g. approximately) simultaneously so that both Raman spectrometry and absorption spectroscopy may take place on gas of at least approximately the same make-up. The sample extraction valve 412 may control the flow of gas from the gas source to both cells 414, 415.

In the system 400, one or more valves may control gas flows. For example, a valve 434 may control flow of the gas mixture to the absorption cell 414, allowing for the inflow of a control or purge gas from a gas cylinder 436. The purge gas may be used to flush the absorption cell 414 and/or the Raman cell 415, if needed to confirm performance of the cell. As mentioned above, the valve 412 may control the flow of gas from the source 410 to the cells 414, 415. If gas sampling is done periodically, then the valve 412 may be controlled to open at a predetermined time interval. Conversely, if analysis and sampling is done in a substantially continuous manner, the valve 412 may close only periodically, for example when the analysis system is taken off-line.

While the sample cell 414 is described herein with a mirror 424 and a reflector, it will be understood that other sample cell configurations are also within the scope of the current subject matter. For example, a multi-pass sample cell including more than one mirror can be used, and the beam of light can enter the volume 432 either though a window or other gas-impervious surface or through an open port or the like. The absorption cell can optionally include an open volume through which gas passes while the beam of light passes through it.

In other implementations of the current subject matter, Raman spectroscopy and absorption spectroscopy measurements can be completed with one light source in a same sample cell. A two-cell approach as discussed above enables enhancement of the Raman signal by using high pressure. The Raman "cell" can optionally be the gas supply itself, for example using a probe inserted directly into the gas supply 410 as discussed in more details below. However, a one-cell approach can lead to instrument simplification and possibly to reduced costs, for example in reduced redundancies in temperature control systems, valving, other measurement system monitoring equipment, etc.

Figure 5:
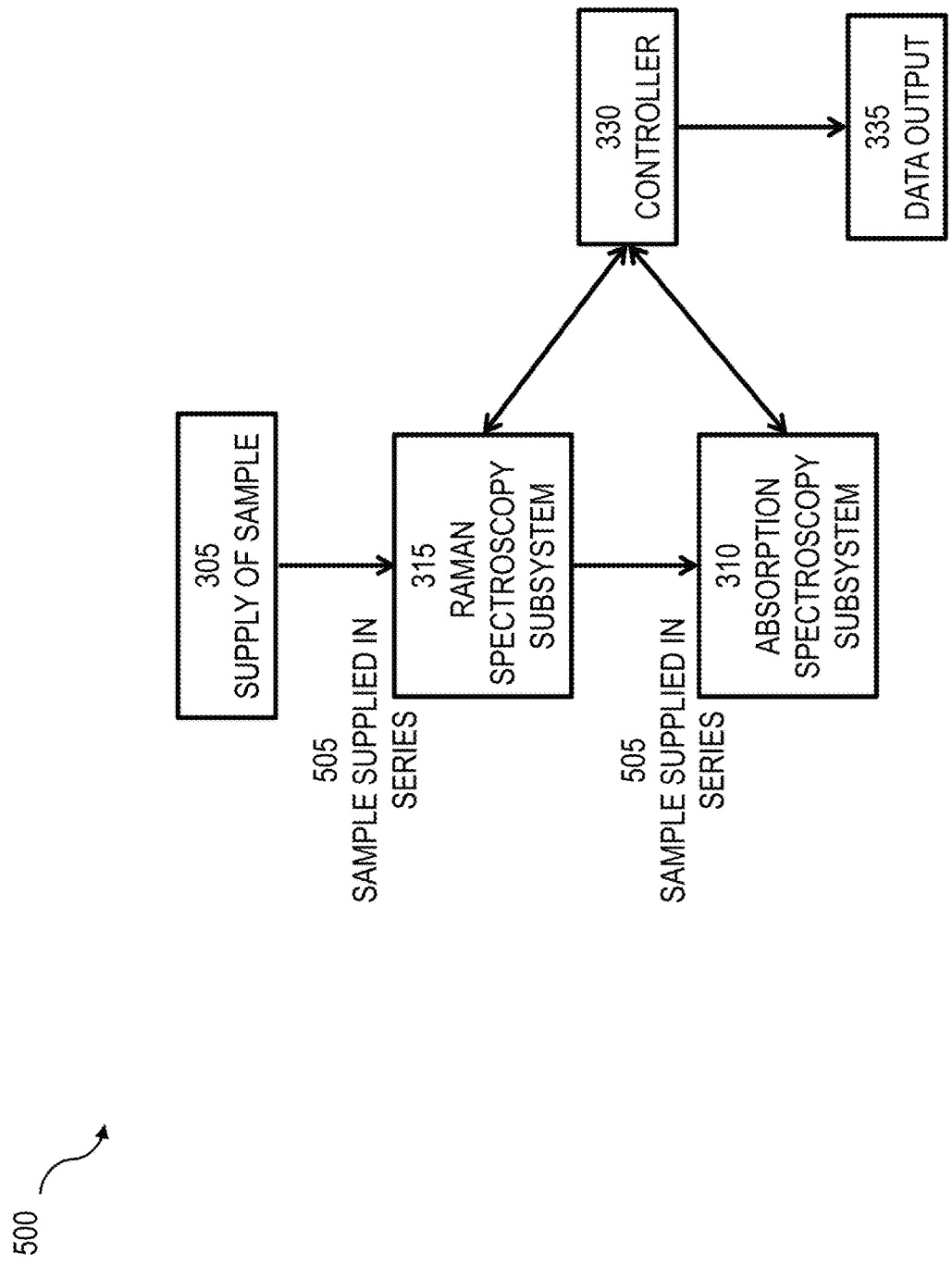
FIG. 5 shows a block diagram of another exemplary system for detection of at least one target analyte consistent with implementations of the current subject matter.

FIG. 5 is a schematic of another exemplary system 500 for analysis of a gas mixture. As in FIG. 3, the system 500 includes a gas supply 305, an absorption spectroscopy subsystem 310, a Raman spectroscopy subsystem 315, a system controller 330, and a data output component 335. The difference between system 300 and system 500 is that in system 500, the gas mixture is provided as a sample in a serial manner 505. The system 500 is shown with the Raman spectroscopy subsystem 315 receiving the gas sample before the absorption spectroscopy subsystem 310, but it should be noted that the absorption spectroscopy subsystem 310 can receive the gas sample before the gas is provided to the Raman spectroscopy subsystem 315. As in FIG. 3, the Raman spectroscopy subsystem 315 provides data to the analysis component that models the absorption data so that the system can provide improved analyte concentration data to the data output component 335, such as through the controller 330.

Figure 6:
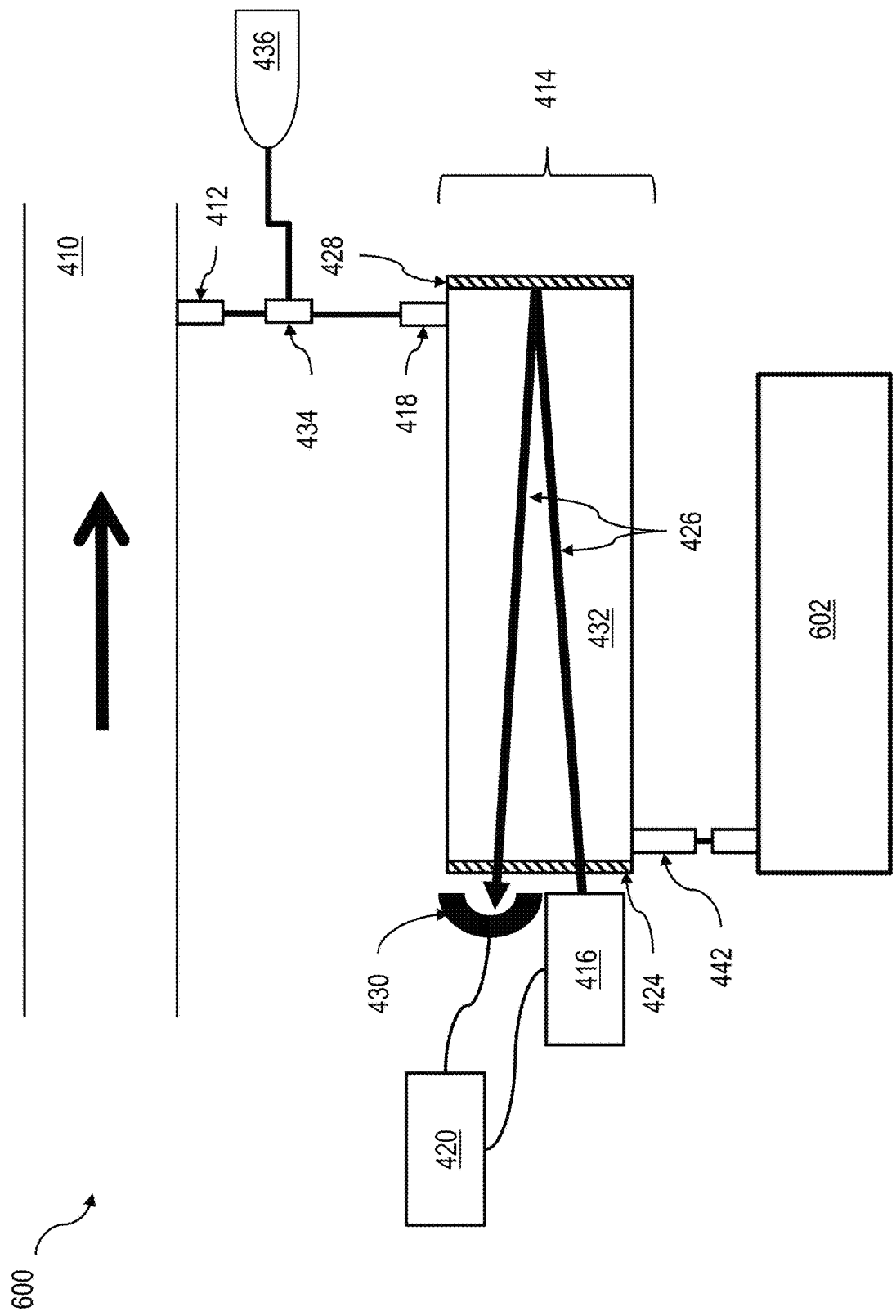
FIG. 6 is a diagram illustrating aspects of another system showing features consistent with implementations of the current subject matter.

FIG. 6 is a schematic of a system 600 for analysis of a gas mixture in which Raman spectroscopy and absorption spectroscopy are done in series. In the system 600, there is a gas source 410, a sample extraction valve 412, an absorption cell 414, a light source 416, and a controller 420. There is also a second valve 634 that controls the flow of a purge gas from a cylinder 436 into the absorption cell 614.

In the system, the gas to be analyzed flows from the gas source 410, which can be a pipeline. The sample extraction valve 412 may control the flow of gas from the source 410 so that the gas flows through lines to an inlet 418 into the absorption cell 414. The gas fills a volume 432 of the absorption cell 414. The light source 416 generates a beam of light that shines into the cell 614 through a window 424 and reflects off a mirror 428. Depending on the dimensions of the optical cell 614, the beam of light may have a path length 426 that reflects multiple times within the optical cell 614. Eventually, the path length 426 leads out of the cell 414, through the window 424 to a detector 430. The detector 430 may include mirrors, beam splitters, filters, and gratings to adjust detection parameters. The controller 420 may cause the light source 416 to emit light at set time intervals or to change the wavelength of the light emitted, if needed.

Once a sample of gas has been analyzed using absorption spectroscopy, the gas may leave the interior of absorption cell 414 through and outlet 442 to a Raman system 602. The Raman system 602 may be functionally similar to the Raman System 415 discussed above in reference to FIG. 4. However, the Raman system 602 may include its own dedicated light source, which may operate at a different wavelength than that of the absorption cell light source 416. In practice, the optimum wavelength for absorption cell detection of a target analyte may be different from the optimum wavelength for Raman detection of the higher concentration background gas constituents.

If needed, the absorption cell 414 and/or Raman system 602 may be purged between samples, using purge gas from the cylinder 436, with the flow of the purge gas controlled by the valve 434.

As in the system of FIG. 4, the controller 420 may collect and transmit data from the detector 430 and the Raman system 602. The data may be collected with each analysis technique. When analyzing a gas sample, the absorption cell 414 may collect data and then the gas may be streamed to the Raman system 602 for analysis. After the Raman analysis, the absorption measurements may be mathematically adjusted, such as by data analysis components or modules within the controller. Though the system 600 is described with the absorption cell 414 receiving the gas sample first and the Raman system 602 receiving the gas sample afterwards, the order may be switched. In some implementations, the Raman system 602 may receive the gas sample first, obtain Raman spectra for the sample, and pass the gas sample on to the absorption cell 414. Alternatively, the Raman system 602 can receive the sample gas first and then pass the sample gas to the absorption cell 414.

In some further implementations of the current subject matter, the Raman system can include a Raman probe that can be inserted directly into a high pressure gas stream or gas vessel, such as for example a natural gas pipeline, a high pressure chemical process reactor (e.g. a cracker, etc.), or the like. High pressure generally increases the Raman signal. Raman spectrometry can be used consistent with implementations of the current subject matter to determine the major constituents and concentrations (e.g. at percent or perhaps parts per thousand or parts per ten thousand levels). A stronger Raman signal does not generally cause measurement problems. An example of a suitable probe for high pressure and even cryogenic Raman measurements include the AirHead™ Probe available from Kaiser Optical Systems, Inc. of Ann Arbor, Mich.

In use, prior to actively characterizing a gas mixture, such as a fuel or a flue gas, a Raman spectroscopy subsystem can be calibrated to measure likely components of the background of the gas mixture. Such likely components can include hydrocarbons, hydrogen gas ($H_2$), nitrogen gas ($N_2$), oxygen ($O_2$), chlorine gas ($Cl_2$), carbon dioxide ($CO_2$), carbon monoxide (CO), and the like. The likely components can be present in the calibration gas mixtures on the percent level (% level), as opposed to on a smaller scale, such as the ppm (part per million) level. The user can also calibrate the absorption subsystem to measure the one or more target analyte present in a level ranging from the ppb level to the % level in at least one gas mixture of known composition, particularly the gas mixture the user employed to calibrate the Raman spectroscopy subsystem. The user can confirm the calibration of the complete system by passing the data from the Raman spectroscopy subsystem to the absorption subsystem, modeling the absorption spectrometer reading as one or more functions of the background composition of the gas mixture, and then confirming that the concentration of the one or more target analyte corresponds to the known value for the calibration gas mixture.

Once the system is calibrated, the gas source provides the gas mixture, either by allowing the system in situ access or by providing discrete samples, to the Raman spectroscopy subsystem and the absorption subsystem. The Raman spectroscopy subsystem and the absorption subsystem can access the gas mixture simultaneously or in series, with the Raman spectroscopy subsystem analyzing the gas mixture before or after the absorption subsystem. The Raman spectroscopy subsystem produces Raman spectral data from its interaction with the gas mixture. The Raman spectral data can include Stokes and anti-Stokes scattering data, as well as intensity values as a function of wavenumber for one or more excitation wavelength. This Raman spectral data can be stored on the analysis component of the Raman spectroscopy subsystem or on the controller.

The absorption subsystem produces absorption data from its interaction with the gas, including absorption data corresponding to more than one excitation wavelength, without correction to the data. From this initial absorption data, the absorption subsystem can derive a raw value ($R_{raw}$) for the concentration of one or more target analyte in the gas mixture. This initial absorption data can be stored on the analysis component of the absorption subsystem or on the controller.

To improve the values for the concentration of the one or more target analyte in the gas mixture, the controller passes background composition concentration data for the gas sample to the analysis component of the absorption subsystem. The absorption subsystem then utilizes the background composition concentration data to correct for the temperature and/or the presence of particular background species, as described above. The resulting corrected concentration value for each target analyte ($R_c$ for each analyte) is then passed by the controller to the user for review or to other systems which can affect any changes to the handling of the gas mixture, such as alteration of gas flows, scrubbing, or mixing. In some variations, the analysis component of a TDLAS system (or optionally an analysis system that includes both a Raman spectrometer and an absorption spectrometer such as a TDLAS) can receive Raman spectral data and can generate the background composition concentration data directly such that these background composition concentration data are then used in the modeling of the absorption spectrometer measurement data obtained for the gas sample. The Raman spectral data can include measurements over wavenumbers indicative of one or more of: methane and/or other hydrocarbon species, hydrogen gas ($H_2$), nitrogen gas ($N_2$), oxygen gas ($O_2$), chlorine gas ($Cl_2$), carbon dioxide ($CO_2$), carbon monoxide (CO), ammonia ($NH_3$), hydrogen-sulfide ($H_2S$), sulfur compounds, fluoro-carbons, chloro-carbons, hydro-fluoro-carbons, hydro-chloro-carbons and hydro-fluoro-chloro-carbons.

As described above, the corrected concentration value for one or more target analytes can be the result of modeling the absorption spectrum for the gas mixture as one or more functions of the background composition. The function can be linear or non-linear, including one or more functions derived using any multivariate analysis methods, such as a classical least square regression (CLS), an inverse least square regression (ILS), a principal component analysis (PCA), a principal component regression (PCR), a partial least square regression (PLS), a multivariate linear regression (MLR), and the like.

The one or more functions used to model the absorption data can vary with the background composition, or the one or more functions can vary with both the $R_{raw}$ and the background composition. The following mathematical equations are exemplary models for arriving at corrected concentration values for the one or more target analyte present in the gas mixture:

$R_c = f(R_{raw}, \text{background composition})$ $R_c = R_{raw} + f(\text{background composition})$ $R_c = \Sigma_0^n f_i(\text{background compsition}) R_{raw}^i$ $R_c = f(R_{raw}, \text{background composition, temperature, pressure})$, wherein the temperature and pressure are of the gas mixture and may be derived from the Raman spectral data, from a pressure transducer and a temperature transducer, from a combination of Raman and transducer generated values, or the like.

In some implementations, the system can include an algorithm that models and corrects each spectrum generated by the absorption subsystem instead of the concentration of each target analyte. The model or models used to correct the full absorption spectrum can be roughly calibrated prior by measuring a gas mixture of known composition. The system can store the data from such calibration exercises in memory. The memory may be associated with the analysis component that includes the modeling algorithm for correcting the full absorption spectrum. In use, while characterizing actual gas streams, periodic or continuous refinement of the model of the full absorption spectrum can be done. The refinement can employ outlier spectra detected by the absorption subsystem, the Raman spectroscopy subsystem, or both subsystems, depending on the model used and the thresholds selected by the user. The analysis methods that the algorithm can employ to model and correct full absorption spectra can include multivariate analysis methods such as CLS, ILS, PCA, PCR, PLS, MLR, and the like.

For example, during calibration, a full spectrum of a gas mixture of known composition can be measured and recorded. This calibration data can be modeled as a combination of individual spectra corresponding to each of the prominent background constituents, as well as the one or more target analyte. Following calibration, the system can be provided with a gas mixture of unknown composition. The Raman spectroscopy subsystem obtains data, such as composition data, regarding this mixture. Those data, in conjunction with the model developed during calibration, are provided to the absorption subsystem to refine the absorption spectrum, as well as to allow for background subtraction so that the system can calculate the concentration of the one or more target analyte, such as by using a multivariate analysis method.

Aspects of the subject matter described herein can be embodied in systems, apparatus, methods, and/or articles depending on the desired configuration. Some implementations of the subject matter described herein can be realized in digital electronic circuitry, integrated circuitry, specially designed ASICs (application specific integrated circuits), FPGAs (field programmable logic arrays) computer hardware, firmware, software, and/or combinations thereof. These various implementations can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device.

These computer programs (also known as programs, software, software applications, applications, components, or code) include machine instructions for a programmable processor, and can be implemented in a high-level procedural and/or object-oriented programming language, and/or in assembly/machine language. As used herein, the term "machine-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method comprising:
    receiving, at one or more programmable processors, background composition concentration data representative of an actual background composition of a gas sample, the background composition concentration data comprising data obtained for the gas sample using a first analysis approach, the actual background composition comprising a plurality of chemical species, wherein the first analysis approach includes Raman spectroscopy, and the background composition concentration data includes Raman spectral data;
    further receiving, at the one or more programmable processors, absorption spectroscopy data for the gas sample, the absorption spectroscopy data obtained by a second analysis approach comprising absorption spectroscopy;
    modeling, by the one or more programmable processors, the absorption spectroscopy data as one or more functions of the actual background composition of the gas sample, the modeling comprising generating mathematical representations of structural interference and/or collisional broadening effects based on the actual background composition concentration data;
    correcting, by the one or more programmable processors, based on the modeling, an analysis of the absorption spectroscopy data, the correcting comprising applying one or more multivariate regression analysis algorithms to compensate for structural interference and/or collisional broadening effects on the absorption spectroscopy data due to the actual background composition of the gas sample; and
    determining, by the one or more programmable processors, a concentration of a target analyte concentration in the gas sample based on the corrected analysis of the absorption spectroscopy data obtained by the second analysis approach.

2. The method of claim 1, wherein the actual background composition comprises a plurality of chemical species whose concentrations in the gas sample vary sufficiently over time to cause variation in the determined target analyte concentration if the one or more multivariate regression analysis algorithms are not applied to correct the analysis of the absorption spectroscopy data obtained by the second analysis approach.

3. The method of claim 1, wherein the absorption spectroscopy data are obtained substantially simultaneously to the Raman spectral data.

4. The method of claim 1, wherein the absorption spectroscopy data are obtained sequentially with the Raman spectral data.

5. The method of claim 1, wherein the Raman spectral data are obtained in situ on a gas within a gas source, and wherein the gas sample for use in the second analysis approach is extracted from the gas source substantially concurrently with the obtaining of the Raman spectral data.

6. The method of claim 1, further comprising determining a temperature and/or a pressure of the gas sample based on the Raman spectral data.

7. The method of claim 1, wherein the Raman spectral data comprises measurements over wavenumbers indicative of one or more of: hydrocarbon species, hydrogen gas (Hz), nitrogen gas ($N_2$), oxygen gas ($O_2$), chlorine gas ($Cl_2$), carbon dioxide ($CO_2$), carbon monoxide (CO), ammonia ($NH_3$), hydrogen-sulfide ($H_2S$), sulfur compounds, fluorocarbons, chloro-carbons, hydro-fluoro-carbons, hydrofluoro-chloro-carbons, and hydro-chloro-carbons.

8. The method of claim 1, wherein the sample gas comprises hydrocarbon gases.

9. The method of claim 1, wherein the one or more target analyte comprises at least one of acids, bases, hydrogen sulfide ($H_2S$), other sulfur compounds, hydrogen chloride (HCl), hydrogen fluoride (HF), hydrogen bromide (HBr), other acids, water or water vapor ($H_2O$), hydrogen cyanide (HCN), ammonia ($NH_3$), arsine ($AsH_3$), phosphine ($PH_3$), oxygen ($O_2$) carbon monoxide (CO), carbon dioxide ($CO_2$), methane ($CH_4$), ethane ($C_2H_6$), ethene ($C_2H_4$), ethylene ($C_2H_2$), other hydrocarbons, hydro-fluoro-carbons, hydro-chloro-carbons, and hydro-fluoro-chloro-carbons.

10. The method of claim 1, wherein the second analysis approach comprises at least one of tunable diode laser absorption spectroscopy, tunable semiconductor laser absorption spectroscopy, and infrared spectroscopy using filter-based and/or grating-based light sources.

11. The method of claim 1, further comprising obtaining the absorption spectroscopy data for the gas sample via operation of an absorption spectrometer and obtaining the Raman spectral data via operation of a Raman spectrometer.

12. A system comprising:
    computer hardware configured to perform operations comprising:
        receiving background composition concentration data representative of an actual background composition of a gas sample, the background composition concentration data comprising data obtained for the gas sample using a first analysis approach, the actual background composition comprising a plurality of chemical species, wherein the first analysis approach includes Raman spectroscopy, and the background composition concentration data includes Raman spectral data;

further receiving absorption spectroscopy data for the gas sample, the absorption spectroscopy data obtained by a second analysis approach comprising absorption spectroscopy;

modeling the absorption spectroscopy data as one or more functions of the actual background composition of the gas sample, the modeling comprising generating mathematical representations of structural interference and/or collisional broadening effects based on the actual background composition concentration data;

correcting, based on the modeling, an analysis of the absorption spectroscopy data, the correcting comprising applying one or more multivariate regression analysis algorithms to compensate for structural interference and/or collisional broadening effects on the absorption spectroscopy data due to the actual background composition of the gas sample; and determining a concentration of a target analyte concentration in the gas sample based on the corrected analysis of the absorption spectroscopy data obtained by the second analysis approach.

13. The system of claim 12, wherein the actual background composition comprises a plurality of chemical species whose concentrations in the gas sample vary sufficiently between over time to cause variation in the determined target analyte concentration if the one or more multivariate regression analysis algorithms are not applied to correct the analysis of the absorption spectroscopy data obtained by the second analysis approach.

14. The system of claim 12, further comprising a Raman spectroscopy subsystem for obtaining Raman spectral data as the background composition concentration data, and further comprising an absorption spectroscopy subsystem for executing the second analysis approach.

15. The system of claim 14, wherein the Raman spectroscopy subsystem comprises an in situ probe configured to obtain the Raman spectral data from within a gas source, and wherein the system includes a gas sampling system for extracting the gas sample from the gas source substantially concurrently with the obtaining of the Raman spectral data by the probe.

16. The system of claim 12, wherein the modeling comprises generating mathematical representations of structural interference and collisional broadening effects.

17. A computer program product comprising a non-transitory computer-readable medium storing instructions that, when executed by at least one programmable processor, cause the at least one programmable processor to perform operations comprising:

receiving background composition concentration data representative of an actual background composition of a gas sample, the background composition concentration data comprising data obtained for the gas sample using a first analysis approach, the actual background composition comprising a plurality of chemical species, wherein the first analysis approach includes Raman spectroscopy, and the background composition concentration data includes Raman spectral data;

further receiving absorption spectroscopy data for the gas sample, the absorption spectroscopy data obtained by a second analysis approach comprising absorption spectroscopy;

modeling the absorption spectroscopy data as one or more functions of the actual background composition of the gas sample, the modeling comprising generating mathematical representations of structural interference and/or collisional broadening effects based on the actual background composition concentration data;

correcting, based on the modeling, an analysis of the absorption spectroscopy data, the correcting comprising applying one or more multivariate regression analysis algorithms to compensate for structural interference and/or collisional broadening effects on the absorption spectroscopy data due to the actual background composition of the gas sample; and determining a concentration of a target analyte concentration in the gas sample based on the corrected analysis of the absorption spectroscopy data obtained by the second analysis approach.

18. The method of claim 1, wherein the modeling comprises generating mathematical representations of structural interference and collisional broadening effects.

* * * * *